（12) United States Patent
Kaitila et al.

(10) Patent No.: US 6,480,074 B1
(45) Date of Patent: Nov. 12, 2002

(54) METHOD AND SYSTEM FOR WAFER-LEVEL TUNING OF BULK ACOUSTIC WAVE RESONATORS AND FILTERS BY REDUCING THICKNESS NON-UNIFORMITY

(75) Inventors: Jyrki Kaitila; Pasi Tikka, both of Helsinki; Juha Ellä, Halikko, all of (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/845,096

(22) Filed: Apr. 27, 2001

(51) Int. Cl.[7] .............................. H03H 3/02; H03H 9/56
(52) U.S. Cl. ..................... 333/188; 333/189; 333/191; 310/312; 29/25.35; 427/100; 427/569; 427/572; 427/585; 427/596; 427/586
(58) Field of Search .................... 333/186–192; 310/312; 29/25.35; 427/569, 585, 586, 596, 100, 572

(56) References Cited

U.S. PATENT DOCUMENTS

| 4,343,827 A | * | 8/1982 | Thompson | 427/8 |
| 4,454,639 A | * | 6/1984 | Dworsky et al. | 29/25.35 |
| 4,638,536 A | * | 1/1987 | Vig | 29/25.35 |
| 4,761,298 A | * | 8/1988 | Vig | 427/10 |
| 5,382,930 A | * | 1/1995 | Stokes et al. | 333/191 |
| 5,630,949 A | * | 5/1997 | Lakin | 216/61 |
| 5,643,629 A | * | 7/1997 | Sauerland | 427/8 |
| 5,662,782 A | * | 9/1997 | Gomi et al. | 204/192.34 |
| 5,780,713 A | * | 7/1998 | Ruby | 73/1.82 |
| 5,894,647 A | * | 4/1999 | Lakin | 29/25.35 |
| 6,051,907 A | * | 4/2000 | Ylilammi | 310/312 |
| 6,081,171 A | | 6/2000 | Ella | 333/189 |

* cited by examiner

*Primary Examiner*—Robert Pascal
*Assistant Examiner*—Barbara Summons
(74) *Attorney, Agent, or Firm*—Ware, Fressola, Van Der Sluys & Adolphson LLP (57) ABSTRACT

A method and system for tuning a bulk acoustic wave device at wafer level by reducing the thickness non-uniformity of the topmost surface of the device using a chemical vapor deposition process. A light beam is used to enhance the deposition of material on the topmost surface at one local location at a time. Alternatively, an electrode is used to produce plasma for locally enhancing the vapor deposition process. A moving mechanism is used to move the light beam or the electrode to different locations for reducing the thickness non-uniformity until the resonance frequency of the device falls within specification.

28 Claims, 7 Drawing Sheets

METHOD AND SYSTEM FOR WAFER-LEVEL TUNING OF BULK ACOUSTIC WAVE RESONATORS AND FILTERS BY REDUCING THICKNESS NON-UNIFORMITY

FIELD OF THE INVENTION

The present invention relates generally to bulk acoustic wave resonators and filters and, more particularly, to the tuning of such resonators and filters.

BACKGROUND OF THE INVENTION

Figure 1:
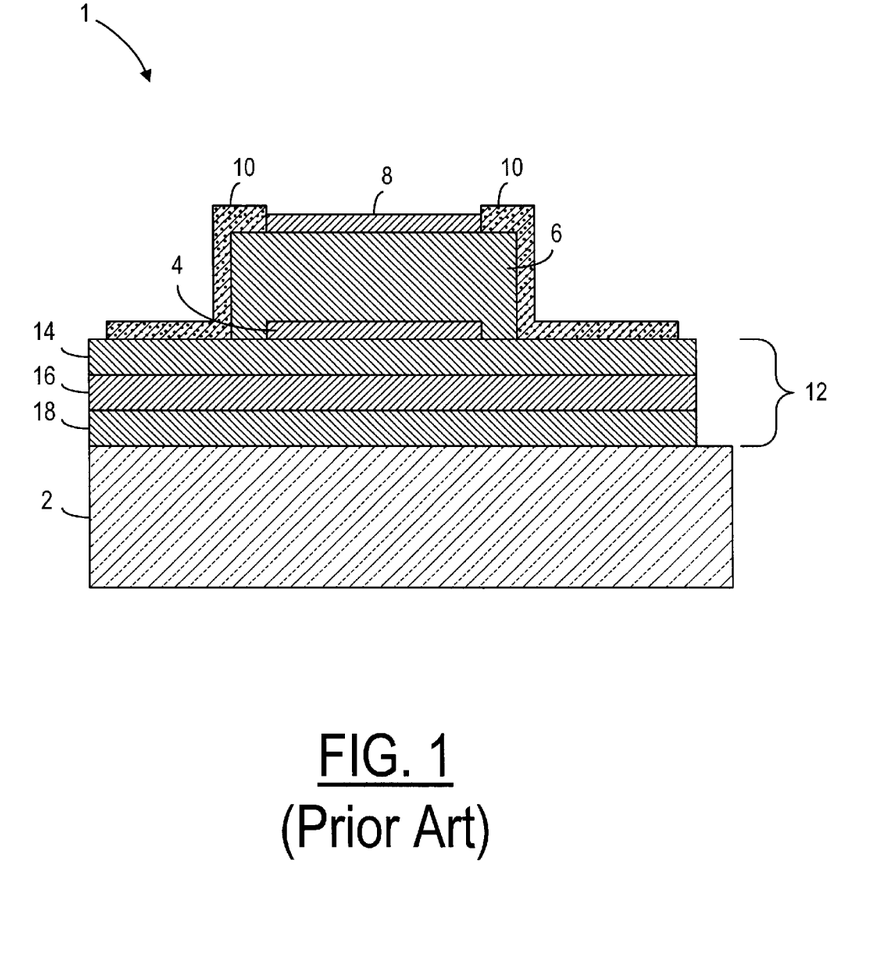
FIG. 1 is a cross sectional side view of a typical bulk acoustic wave device illustrating a plurality of bulk acoustic wave generating and controlling layers.

It is known that a bulk acoustic-wave (BAW) device is, in general, comprised of a piezoelectric layer sandwiched between two electronically conductive layers that serve as electrodes. When a radio frequency (RF) signal is applied across the device, it produces a mechanical wave in the piezoelectric layer. The fundamental resonance occurs when the wavelength of the mechanical/acoustic wave (produced by the RF signal) is about twice the thickness of the piezoelectric layer. Although the resonant frequency of a BAW device also depends on other factors, the thickness of the piezoelectric layer is the predominant factor in determining the resonant frequency. As the thickness of the piezoelectric layer is reduced, the resonant frequency is increased. BAW devices have traditionally been fabricated on sheets of quartz crystals. In general, it is difficult to achieve a device of high resonant frequency using this fabrication method. Fabricating BAW devices by depositing thin-film layers on passive substrate materials, one can extend the resonant frequency to the 0.5–10 GHz range. These types of BAW devices are commonly referred to as thin-film bulk acoustic resonators or FBARs. There are primarily two types of FBARs, namely, BAW resonators and stacked crystal filters (SCFs). The difference between these two types of devices lies mainly in their structures. An SCF usually has two or more piezoelectric layers and three or more electrodes, with some electrodes being grounded. FBARs are usually used in combination to produce passband or stopband filters. The combination of one series FBAR and one shunt FBAR makes up one section of the so-called ladder filter. The description of ladder filters can be found, for example, in Ella (U.S. Pat. No. 6,081,171). As disclosed in Ella, a FBAR-based device may have one or more protective layers, commonly referred to as the passivation layers. A typical FBAR-based device is shown in FIG. 1. As shown in FIG. 1, the FBAR device 1 comprises a substrate 2, a bottom electrode 4, a piezoelectric layer 6, a top electrode 8 and a passivation layer 10. The FBAR device 1 may additionally include an acoustic mirror layer 12, which is comprised of a layer 16 of high acoustic impedance sandwiched between two layers 14 and 18 of low acoustic impedance. The mirror usually, but not always, consists of pairs of high and low impedance layers (an even number of layers). Some mirrors consist of two pairs of such layers arranged in a sequence like $SiO_2$, W, $SiO_2$, W. Instead of the mirror, an FBAR device may additionally include one or more membrane layers of $SiO_2$ and a sacrificial layer. The substrate 2 can be made from silicon (Si), silicon dioxide ($SiO_2$), Galium Arsenide (GaAs), glass, or ceramic materials. The bottom electrode 4 and top electrode 8 can be made from gold (Au), molybdenum (Mo), tungsten (W), copper (Cu), Nickel (Ni), Niobium (Nb), silver (Ag), tantalum (Ta), cobalt (Co), aluminum (Al), titanium (Ti) or other electrically conductive materials. The piezoelectric layer 6 can be made from zinc oxide (ZnO), zinc sulfide (ZnS), aluminum nitride (AlN), lithium tantalate ($LiTaO_3$) or other members of the so-called lead lanthanum zirconate titanate family. The passivation layer can be made from $SiO_2 Si_3 N_4$ or polyimide. The low acoustic impedance layers 14 and 18 can be made from Si, $SiO_2$ poly-silicon, Al or a polymer. The high acoustic impedance layer 16 can be made from Au, Mo or tungsten (W), and in some cases, dielectric such as AlN to make a number of layer pairs. FBAR ladder filters are typically designed so that the series resonators yield a series resonance at a frequency that is approximately equal to, or near, the desired, or designed, center frequency of the respective filters. Similarly, the shunt, or parallel, resonators yield a parallel resonance at a frequency slightly offset from the series FBAR resonance. The series resonators are usually designed to have their maximum peak in transmission at the center frequency, so that signals are transmitted through the series resonators. In contrast, the shunt resonators are designed to have their minimum in transmission so that signals are not shorted to ground. FBARs yield parallel resonance and series resonance at frequencies that differ by an amount that is a function of a piezoelectric coefficient of the piezoelectric materials used to fabricate the devices, in addition to other factors such as the types of layers and other materials employed within in the device. In particular, FBAR ladder filters yield passbands having bandwidths that are a function of, for example, the types of materials used to form the piezoelectric layers of the resonators and the thickness of various layers in the device.

The difference in the thickness in various layers in the device can be achieved during the fabrication of the device. Presently, FBARs are fabricated on a glass substrate or a silicon wafer. The various layers in the FBAR-based device are sequentially formed by thin-film deposition. In an FBAR-based device, the resonant frequency of the device usually has to be controlled to within a 0.2–0.5% tolerance. This means that the thickness of each layer in the device must be controlled in the same way. It is known that, however, the deposition of thin-film layers is difficult to control to yield a thickness within such tolerance when the area of substrate or wafer is large. For that reason, manufacturers of FBAR-based devices use wafers of 4-inches or less in diameter for device fabrication. With a small wafer or substrate, certain thickness non-uniformity can be accepted without losing many components due to the operation frequency being out of specification. However, fabricating devices on small wafers or substrates is less cost-effective than doing the same on large substrates. In the case of using large substrates, the problem associated with thickness non-uniformity becomes acute.

Thus, it is advantageous and desirable to provide a method and system to solve the problem associated with thickness non-uniformity in the fabrication of FBAR-based devices on large substrates or wafers.

SUMMARY OF THE INVENTION

It is a primary object of the present invention to provide a method and system for achieving a desired resonant frequency of the bulk acoustic wave device within a given tolerance. This object can be achieved by reducing the thickness non-uniformnity of the device on a substrate. The thickness non-uniformity can be reduced by selectively adding material to the topmost surface layer of the wafer, or die, before the wafer is cut into a plurality of device chips. Thus, the wafer has one or more bulk acoustic wave generating and controlling layers formed thereon. In that context, the bulk acoustic wave device, as described herein, refers to the entire wafer or substrate that has one or more layers fabricated thereon to form one or more individual device chips, or part of such wafer or substrate. Moreover, the bulk acoustic wave devices referred to herein include bulk acoustic wave resonators, bulk acoustic wave filters, stack crystal filters, any combination of resonators and filters, and the structural variations of the resonators and filters. Furthermore, although one or more layers are already formed on the wafer or substrate when the thickness non-uniformity of the topmost layer is reduced, the device may or may not have all the necessary layers or the patterns of the layers. For example, the topmost layer of the device can be a piezoelectric layer, or an electrode layer, and one or more layers may be added onto the topmost layer after the thickness of the topmost layer is adjusted.

Thus, according to the first aspect of the present invention, a method of tuning a bulk acoustic wave device comprising a plurality of acoustic wave generating and controlling layers formed on a substrate, wherein the bulk acoustic wave device has a surface layer and a surface layer thickness having a non-uniformity profile, and wherein the bulk acoustic wave device has an operating frequency which varies partly with the surface layer thickness and the operation frequency can be adjusted by adjusting the surface layer thickness in a chemical vapor deposition apparatus, wherein the chemical vapor deposition apparatus contains a gaseous precursor for depositing material on the surface layer for reducing the thickness non-uniformity. The method comprises the steps of:

providing an enhancing medium for locally enhancing the deposition of material on the surface layer at a location; and relocating the enhancing medium in a lateral direction relative to the surface layer to at least one different location for locally enhancing the deposition of material on the surface at said at least one different location.

Preferably, the enhancing medium is a light beam for use in a photon-assisted chemical vapor deposition process. It is also possible that the enhancing medium is a plasma for use in a plasma-induced or plasma-assisted chemical vapor deposition process.

Preferably, the enhancing medium is located at one location within a time period, and the time period is based on the thickness non-uniformity of the surface layer.

The surface layer may comprises a plurality of individual components and the individual components may be resonators, filters, stacked crystal filters or a combination thereof.

It is preferable to adjust the thickness non-uniformity of the piezoelectric layer of the device to tune the bulk acoustic wave device, but it is also possible to change the thickness of the electrode or the passivation layer overlapping an active area of the device.

It is understood that if the thickness of the piezoelectric layer is adjusted according to the above-described method, then a top electrode layer is deposited on the piezoelectric layer after the thickness of the piezoelectric layer is adjusted. It may be necessary to adjust the thickness of the top electrode layer using the same method or other method. Additionally, a patterning step is usually necessary to produce a desired pattern for the electrode layer. The patterning step can be carried out before or after the thickness of the electrode layer is adjusted. The patterning step is not part of the present invention. Furthermore, if a passivation layer is deposited on top of the top electrode layer, it may be necessary to adjust the thickness of the passivation layer. Thus, the thickness adjustment steps, according to the present invention, may be carried out one or more times for tuning the entire device, if necessary.

According to the second aspect of the present invention, a system for tuning a bulk acoustic wave device made of a plurality of acoustic wave generating and controlling layers formed on a substrate, wherein the bulk acoustic wave device has a surface layer and a surface layer thickness having a non-uniformity profile, and wherein the bulk acoustic wave device has an operating frequency which varies partly with the surface layer thickness and the operation frequency can be adjusted by adjusting the surface layer thickness in a chemical vapor deposition apparatus, wherein the chemical vapor deposition apparatus contains a gaseous precursor for depositing material on the surface layer for reducing the thickness non-uniformity. The system comprises:

means, for providing an enhancing medium for locally enhancing the deposition of material on the surface layer at a location; and a moving mechanism, operatively connected to the providing means, for relocating the enhancing medium in a lateral direction relative to the surface layer to at least one different location for locally enhancing the deposition of material on the surface layer at said at least one different location.

Preferably, the enhancing medium comprises a light beam for use in a photon-assisted chemical vapor deposition process, and the providing means comprises a light source.

It is possible that the enhancing medium comprises a plasma for use in a plasma-assisted chemical vapor deposition process, and the providing means comprises an electrode, operatively connected to a radio-frequency (RF) source, to produce ions for providing the plasma.

Preferably, the dwell time, within which the enhancing medium is positioned at a location to enhance the deposition, is based on the thickness non-uniformnity of the surface layer. Thus, it is preferable to have a software program to control the moving mechanism to relocate the enhancing medium according to the thickness non-uniformity profile.

Preferably, the system also comprises a mechanism for mapping the thickness non-uniformity profile of a device surface prior to adjusting the thickness of the surface layer. Preferably, the mapping mechanism comprises a frequency measurement device for measuring the frequency at different locations of the device surface. In that case, the device would already have a patterned top electrode layer. It is also possible to use a thickness measurement device to determine the thickness non-uniformity profile of a surface layer.

The present invention will become apparent upon reading the description taken in conjunction with FIGS. 2 to 7.

DETAILED DESCRIPTION OF THE INVENTION

Figure 2:
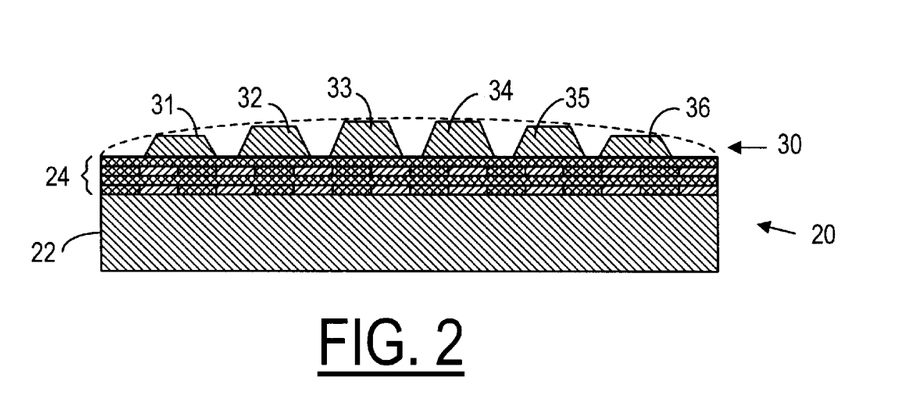
FIG. 2 is a cross sectional view of a simplified bulk acoustic wave device illustrating the thickness non-uniformity of the topmost layer of the device.

FIG. 2 is a cross section view illustrating a simplified bulk acoustic wave device 20 having a top surface layer 30 and a plurality of mirror layers 24 formed on a substrate 22. Some of the mirror layers are patterned. The substrate 22 can be made of Si, GaAs, glass or other material. The top layer 30 may comprise a plurality of resonators (or filters) having top and bottom electrodes, but the top layer 30 may represent a piezoelectric layer, a bottom electrode layer or a top electrode layer. When a bulk acoustic wave generating or controlling layer is formed on a wafer in a thin-film deposition process, the layer is usually thicker in the center portion than the edge portion (see FIG. 6). The thickness non-uniformity of the top surface layer 30 may exceed the tolerance allowed for the spread in the resonant frequency of the device 20. Thus, it is desirable to adjust part of the top surface layer 30 so that the non-uniformity profile of the reduced surface falls within the tolerance. To illustrate the problem associated with the thickness non-uniformity profile of the top surface layer, a plurality of resonators (or filters, stacked crystal filters or a combination thereof) 31–36 with different thicknesses is shown in FIG. 2. The thickness non-uniformity profile of the top surface layer 30, however, can be reduced by increasing the thickness of some of the resonators so that the frequency of each resonator falls within the tolerance.

Figure 3A:
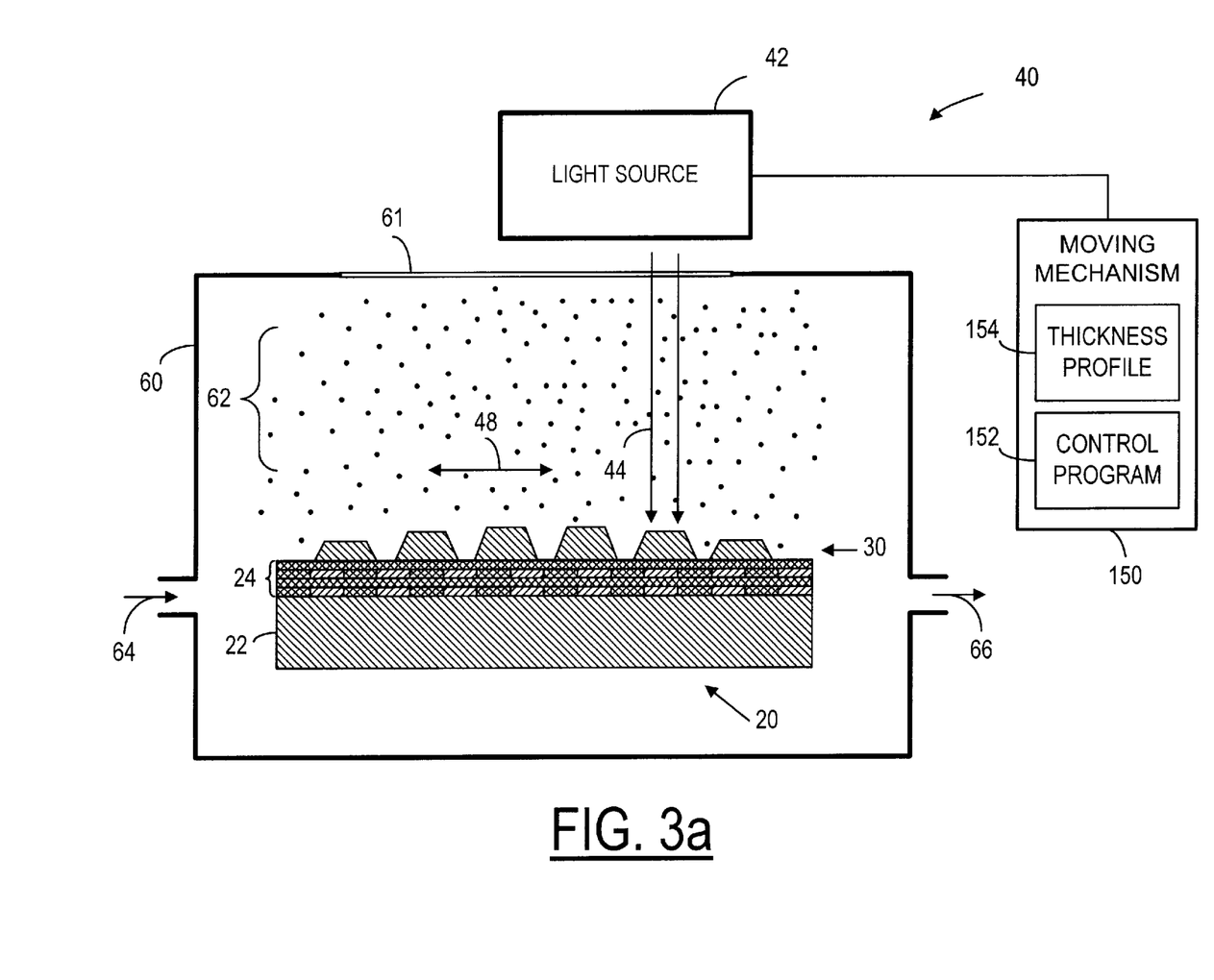
FIG. 3a is a diagrammatic representation illustrating a system for adding material on the topmost layer of the bulk acoustic wave device at wafer level, according to the preferred embodiment of the present invention.

Referring to FIG. 3a, the thickness adjustment system 40, according to the present invention, comprises a chemical vapor deposition chamber 60 having an inlet 64 to provide a gaseous precursor 62 into the chamber 60 and an outlet 66, which is operatively connected to a pumping system (not shown) to adjust the pressure in the chamber 60. As it is known in the art, the gaseous precursor 62 may contain fragments of a desired solid to be deposited to the surface 30 of a bulk acoustic wave device 20. The gaseous precursor 62 is usually brought into the deposition chamber 60 through the inlet 64 by a carrier gas that is not to be deposited. Chemical vapor deposition is commonly used to grow a thin-film on a substrate. For example, a gaseous precursor containing silane ($SiH_4$) and either oxygen ($O_2$) or nitrous oxide ($N_2O$) is used to grow a thin-film of silicon dioxide ($SiO_2$) on a substrate. Another gaseous precursor containing silane and either nitrogen ($N_2$) and/or ammonia $NH_4$) is used to grow a thin-film of silicon nitride ($SiN_2$) on a substrate. In the deposition chamber, energy has to be supplied to the deposition process in order to activate the reactant species. The choice of gaseous precursor 62 depends on the material of the topmost layer 30. Preferably, a dielectric material is used for the gaseous precursor 62 for adding material on a passivation layer. With such a layer, no additional patterning is needed. It is possible to add material on a piezoelectric layer or other layer by using a suitable gaseous precursor containing fragmentation of a suitable solid. For example, it is also possible to deposit tantalum, tungsten and other refractory metals onto an electrode layer. Generally, two methods are used to supply the activation energy: one uses heat and the other uses a radio-frequency (RF) induced plasma. The latter method is also referred to as plasma-enhanced chemical vapor deposition (PECVD). Both methods are widely used in the semiconductor industry to produce a thin-film on an entire wafer. A variation of the CVD method is the so-called photon assisted CVD or photon induced CVD, where the reaction is activated by light, either by heating the substrate surface or dissociating/exciting the reactant species in the gas phase. Generally, ultraviolet lamps or lasers are used as light sources. As shown in FIG. 3a, a light source 42 is used to provide a light beam 44 through a window 61 of the deposition chamber 60. The size of the light beam 44, or the spot size of the assisted deposition, can range from a single resonator (or filter) to a plurality of resonators (or filters). The selection of the spot size depends partly on the tolerance of the resonance frequency and the non-uniformity profile 154 of the wafer or device 20, and partly on the repeatability of the deposition process. However, the important aspect of the present invention is that the chemical deposition process can be enhanced locally so that the thickness of only one section of the wafer is adjusted at a time, based on the thickness non-uniformity profile 154. Accordingly, a moving mechanism 150 is used to move the light source 42 in a lateral direction 48 relative to the device surface 30 for relocating the light beam 44 to a different location of the surface 30. Preferably, the moving mechanism 150 has a control program 152 to control the dwell time of the light beam 44 at each location based on the thickness non-uniformity profile 154. It should be noted that it is also possible to relocate the device 20 while keeping the light beam 44 stationary.

Figure 3B:
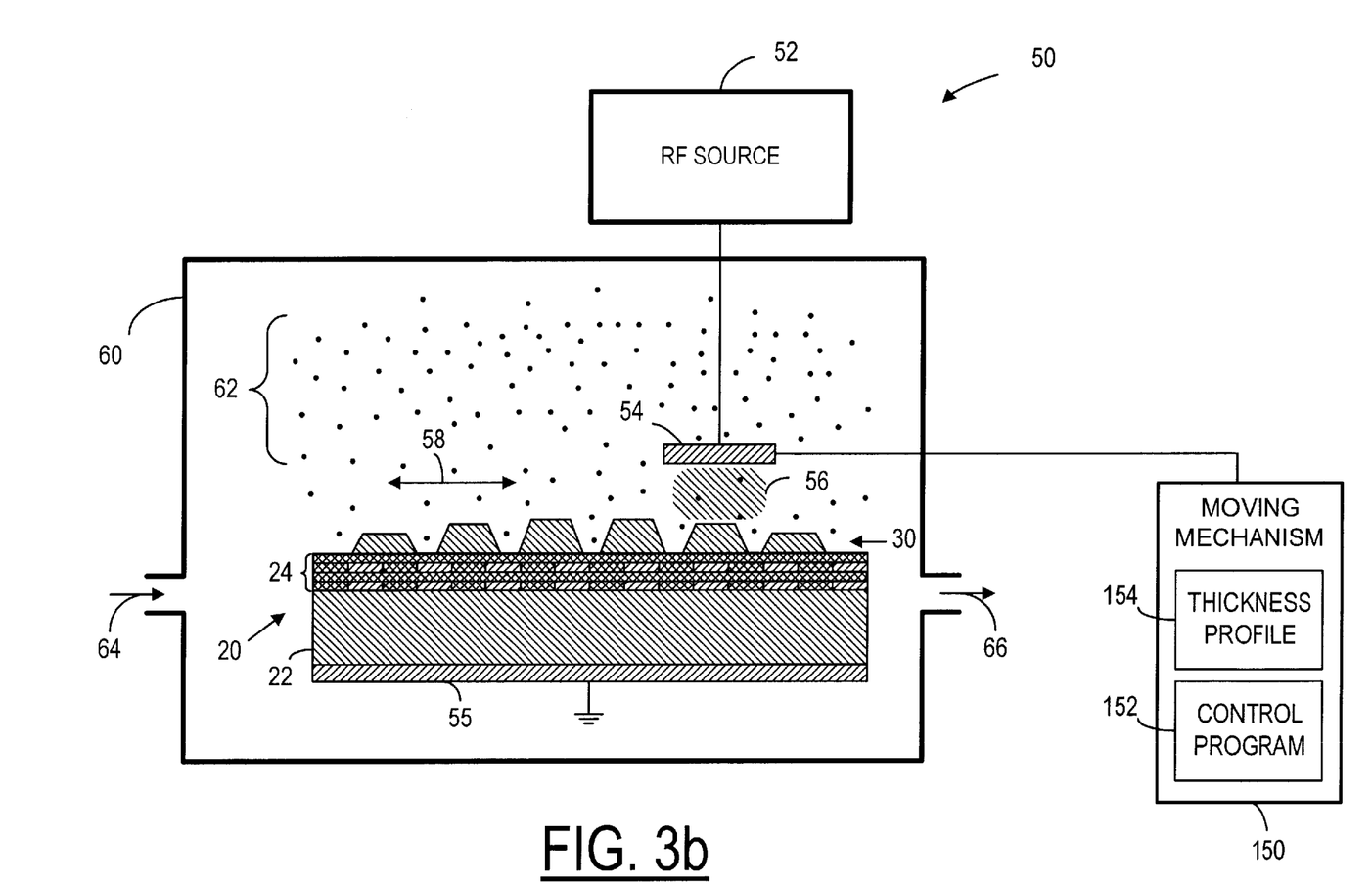
FIG. 3b is a diagrammatic representation illustrating another system for adding material on the topmost layer of the bulk acoustic wave device at wafer level, according to another embodiment of the present invention.

Alternatively, a radio-frequency (RF) source 52 is used in the system 50 to provide power to an electrode 54, coupled to another electrode 55, to assist the chemical vapor deposition process locally. As shown in FIG. 3b, the electrode 54, which is placed above the surface 30, is used to cause plasma glow discharges 56 to form between the electrode 54 and a section of the surface 30. The electrons excited to high energy states in the plasma 56 can dissociate and ionize molecules in the gas phase. These ions are active. Thus, the plasma supplies a particle flow to be deposited on a section of the surface 30. The moving mechanism 150 can be used to move the electrode 54 in a lateral direction 58, relative to the surface 30 to change the deposition locations. It should be noted that it is possible to move the device 20 relative to the electrode 54 or the light beam 44 (FIG. 3a) to change the deposition locations.

Figure 4:
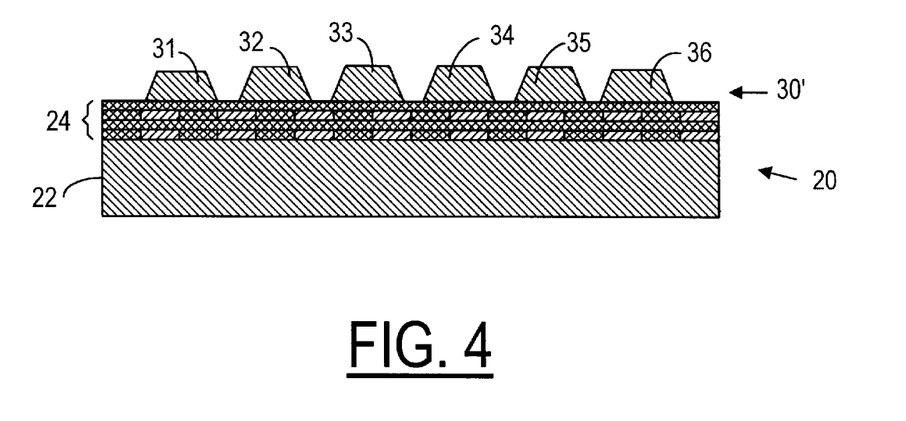
FIG. 4 is cross sectional view illustrating the simplified bulk acoustic wave device after the thickness of the topmost layer has been adjusted.

FIG. 4 shows the result after the thickness non-uniformity of the topmost surface 30' is corrected. It should be noted that, in most cases, the thickness non-uniformity of the topmost surface does not need to be completely eliminated. Usually, it is only required to reduce the thickness non-uniformity so that the spread in the resonant frequency of the bulk acoustic wave device falls within a given tolerance. As shown, the thickness of the resonators 31, 32, 35 and 36 has been increased. Although the thickness of the resonators 31–36 may not be the same, the spread in the resonant frequency of the device falls within the specification.

Furthermore, it is also possible to add one or more bulk acoustic wave generating and controlling layers on top of a thickness-adjusted layer. If the newly-added layer needs thickness adjustment, the same method, as described in conjunction with FIGS. 3a and 3b, can be applied until a desired product is achieved.

Figure 5A:
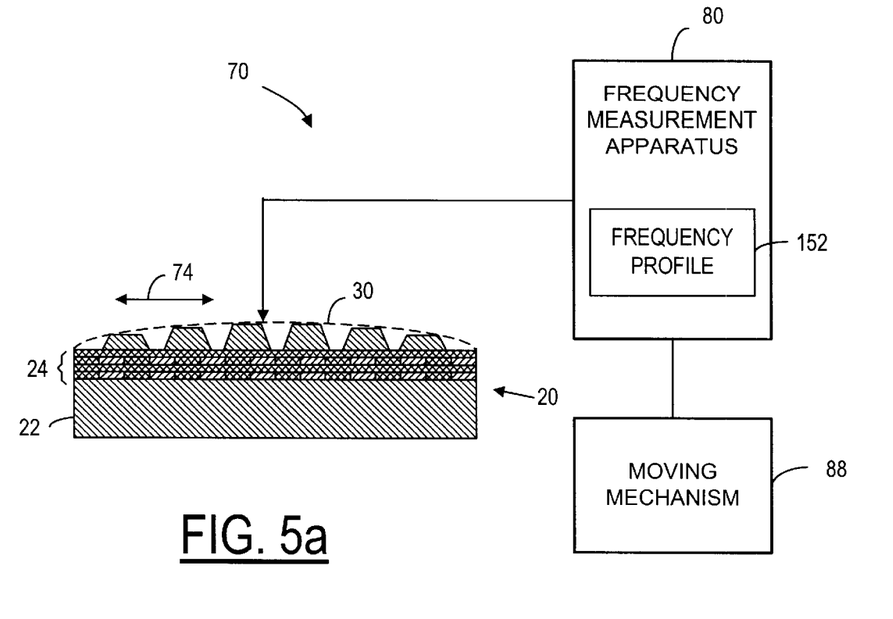
FIG. 5a is a diagrammatic representation illustrating a system for mapping the thickness non-uniformnity profile of a bulk acoustic wave device, according to the present invention.

Prior to thickness adjustment of a topmost surface layer 30 in a locally-enhanced chemical vapor deposition chamber 60, as shown in FIGS. 3a and 3b, it is preferred that the thickness profile 154 be mapped. It is preferable to use a frequency measurement apparatus 80 to perform localized measurement of the resonant frequency of the device 20. It may be necessary to measure the resonant frequency of the individual resonators and/or filters of the device 20. It should be noted that in order to measure the resonant frequency of those components, it is necessary to form and pattern the top electrode layer on the wafer. Based on the frequency profile 152, it is possible to calculate the amount of material to be added on the upper surface 30. As shown in FIG. 5a, the profile mapping system 70 comprises a frequency measurement apparatus 80 and a moving mechanism 88 for moving the frequency measurement apparatus 80 relative to the device 20 for obtaining the frequency profile 152, of the surface. The moving direction is denoted by reference numeral 74. From the frequency profile 152, it is possible to obtain the thickness non-uniformity profile 154 (FIG. 6).

Figure 5B:
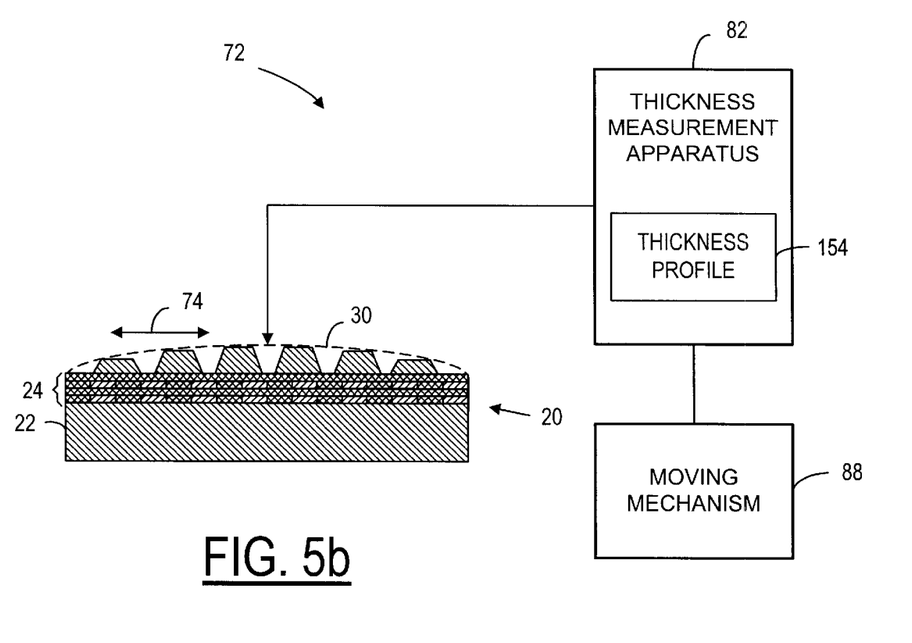
FIG. 5b is a diagrammatic representation illustrating another system for mapping the thickness non-uniformity of a bulk acoustic wave device, according to the present invention.

FIG. 5b is a diagrammatic representation illustrating a system 72 for mapping a bulk acoustic wave device 20 by measuring the physical thickness of the device. Instead of a frequency measurement apparatus 80, a thickness measurement apparatus 82 is used to measure the thickness of the device 20 and obtain the thickness profile 154 directly.

Figure 6:
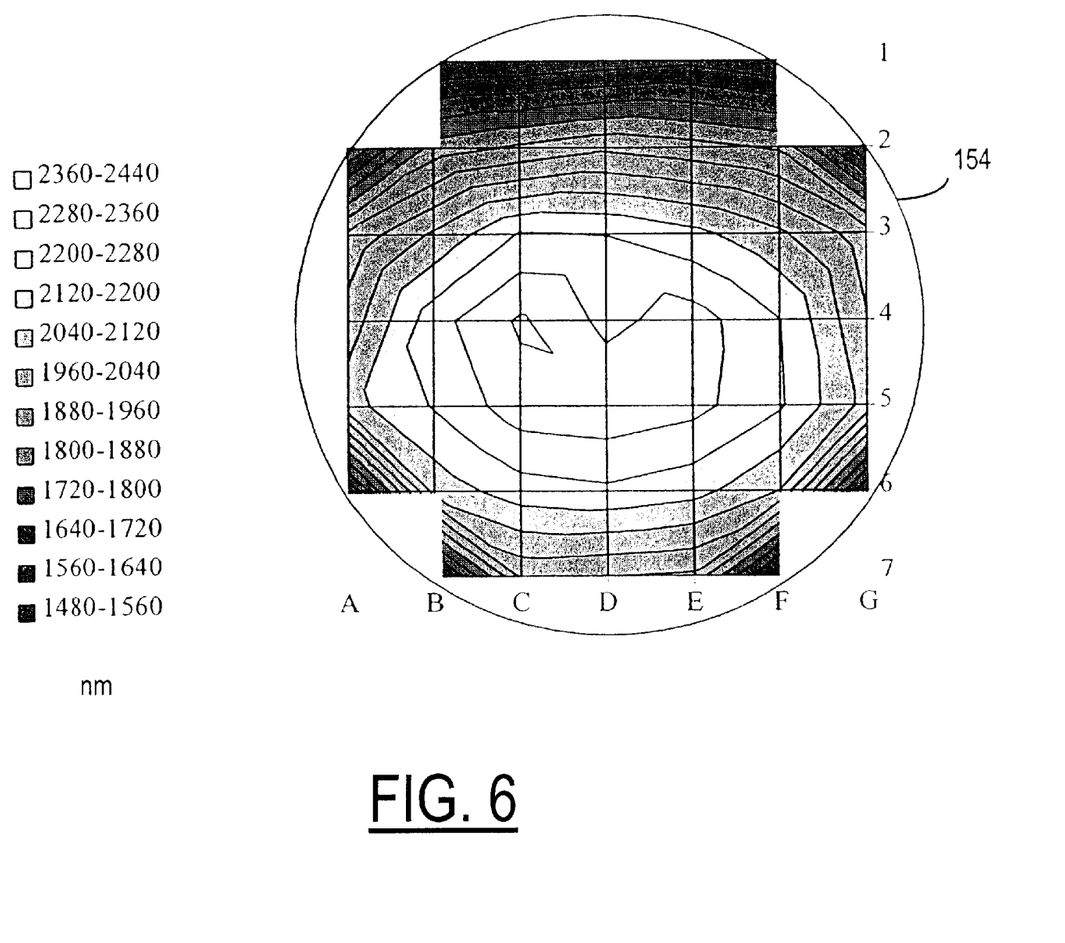
FIG. 6 is a thickness chart illustrating the non-uniformity profile of a wafer with a plurality of bulk acoustic wave generating and controlling layers fabricated thereon.

FIG. 6 is a thickness chart illustrating the non-uniformity thickness profile of a wafer with a plurality of acoustic wave generating and controlling layers fabricated thereon. In particular, FIG. 6 shows the non-uniformity profile of a piezoelectric (ZnO) layer expressed in terms of nanometers. If the average thickness is used as a reference, then the thickness variation across the layer is about ±23%. With such a large variation in thickness, the frequency variation across the wafer is usually not acceptable. Thus, the device must be tuned by adjusting the thickness of the device.

Figure 7:
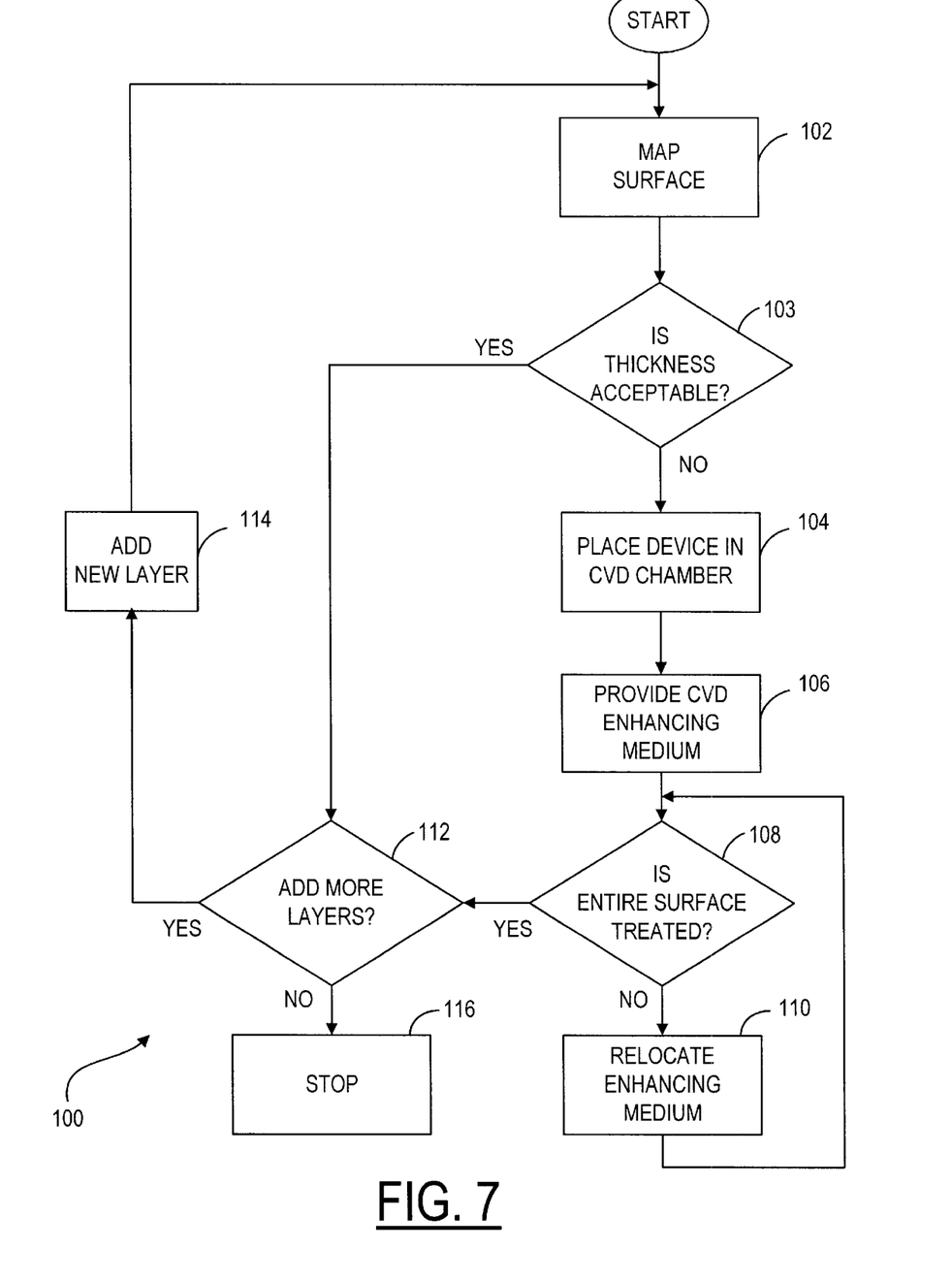
FIG. 7 is a flow chart illustrating the steps for tuning a bulk acoustic wave device at wafer level, according to the present invention.

FIG. 7 is a flow chart illustrating the process 100 for tuning a bulk acoustic wave device, according to the present invention. As shown at step 102, a frequency measurement apparatus (FIG. 5a) or a thickness measurement apparatus (FIG. 5b) is used to map the surface of the device 20. A thickness non-uniformity profile 154 is thus obtained. If the surface layer thickness falls within the tolerance, as determined at step 103, then new layers may be added on top of the mapped surface, as determined at step 112 and carried out at step 114. Otherwise, the device 20 is placed in a locally-enhanced chemical vapor deposition chamber 60 (FIGS. 3a & 3b) for thickness adjustment, at step 104. A CVD enhancement medium is placed at a desired location over the surface layer 30 for adding material thereon for a period of time, at step 106. After the thickness of the local area is adjusted by the locally-enhanced chemical vapor deposition process, it is determined, at step 108, whether the necessary thickness adjustment of the entire surface is carried out. If the thickness at more surface areas needs to be adjusted, the enhancement medium is relocated to a different location, at step 110. If the necessary thickness adjustment of the entire surface has been carried out, it is determined, at step 112, whether more layers need to be fabricated to complete the device. After one or more new layers are added, at step 114, on top of the adjusted layer, the surface profile of the device is again mapped, at step 102, to determine whether the device is made according to the specification.

In summary, the present invention discloses a method and system for tuning the bulk acoustic wave device at a wafer, or die, level. The method and system, as disclosed, are particularly useful when the surface area of the wafer is sufficiently large such that the deposition of thin-film cannot achieve acceptable thickness uniformity. Tuning the frequency across the wafer by adjusting the thickness at localized areas of the wafer surface can increase the yield of the FBAR manufactory process. The thickness adjustment process can be separately and sequentially carried out to adjust at one or more layers of the FBAR-based device. If a material is added onto a surface layer to tune the frequency and a gaseous precursor is used to provide the material to be deposited on the device surface, it is preferable that the gaseous precursor contains the material of the surface layer. For example, if the topmost surface layer to be adjusted is the electrode layer made of tantalum or tungsten, it is preferred that the gaseous precursor contains fragmentation of tantalum or tungsten. However, the material for the gaseous precursor and the material for the surface layer may not be the same. For example, if the topmost surface layer to be adjusted is a mirror or passivation layer of $SiO_2$ the gaseous precursor can contain silane ($SiH_4$) and oxygen ($O_2$).

It is known in the art that the fabrication of the top and bottom electrode layers, in general, involves one or more additional steps to make a pattern out of each of the electrode layers. It is preferred that the patterning steps are carried out after the thickness of the respective electrode layer is adjusted. However, it is also possible to carry out the patterning steps prior to the thickness adjustment.

Furthermore, in the chemical vapor deposition method and system, as described in conjunction with FIGS. 3a and 3b, only one light beam 44 or electrode 54 is used to enhance the local deposition of material on the topmost surface at one location at a time. It is possible to use two or more light beams or electrodes to enhance the deposition at two or more locations simultaneously or sequentially. Moreover. the light beam and the plasma can be relocated by moving the light source (or a light-path modifying device, such as a reflector) or the electrode. It is possible to move the bulk acoustic wave device in a lateral direction, relative to the light beam or plasma.

Moreover, the device, as described hereinabove, usually comprises a plurality of individual chips, each having a chip surface area. In the process, as described in conjunction with FIGS. 3a and 3b, the light beam or the plasma for locally enhancing the chemical vapor deposition at a location defines the spot size for material deposition. The spot size can be smaller or larger than the chip surface area.

It should be noted that the bulk acoustic wave devices, according to the present invention, include individual resonators, stacked crystal filters, ladder filters and the combinations thereof. However, there are other filter types in addition to the ladder structure that can be constructed from FBARs. All of them include some resonators, which have to be tuned, but they cannot be called parallel or shunt resonators in all cases. The balanced filter is an example of such a filter type.

Furthermore, the thickness non-uniformnity, as described hereinabove, is related to the frequency non-uniformity of the BAW devices on the wafer. The purpose of trimming the surface layer is to reduce the frequency non-uniformity of the devices. Thus, trimming the surface layer does not necessarily make the topmost layer perfectly even. In other words, even if the topmost layer has a very uniform thickness, it might be necessary to trim it to correct for the non-uniformity of one or more of the underlying layers. For example, if the topmost layer is a top electrode layer overlying a piezoelectric layer which is not uniform, the purpose of trimming the top electrode layer is for reducing the frequency non-uniformity of the devices due to the thickness non-uniformity of the piezoelectric layer-even if the top electrode layer itself is uniform. The object of the present invention is to achieve the desired uniformity of the final frequency of the devices. Therefore, the surface layer can be a single layer, such as the top, bottom or piezoelectric layer, but the surface layer can also be a combination of layers, such as the combination of the top electrode layer and the piezoelectric layer.

Thus, although the invention has been described with respect to a preferred embodiment thereof, it will be understood by those skilled in the art that the foregoing and various other changes, omissions and deviations in the form and detail thereof may be made without departing from the spirit and scope of this invention.

What is claimed is:

1. A method of tuning a bulk acoustic wave device comprising a plurality of acoustic wave generating and controlling layers formed on a substrate, wherein the bulk acoustic wave device has a surface layer and a surface layer thickness having a non-uniformity profile, and wherein the bulk acoustic wave device has an operating frequency which varies partly with the surface layer thickness and the operation frequency can be adjusted by adjusting the surface layer thickness in a chemical vapor deposition apparatus, wherein the chemical vapor deposition apparatus contains a gaseous precursor for depositing material over the surface layer for reducing the thickness non-uniformity, said method comprising the steps of:

providing an enhancing medium for locally enhancing the deposition of material on the surface layer at a location; and relocating the enhancing medium in a lateral direction relative to the surface layer to at least one different location for locally enhancing the deposition of material on the surface layer at said at least one different location.

2. The method of claim 1, wherein the enhancing medium is a light beam for use in a photon-assisted chemical vapor deposition process.

3. The method of claim 1, wherein the enhancing medium is a plasma for use in a plasma-induced chemical vapor deposition process.

4. The method of claim 1, wherein the enhancing medium is a plasma for use in a plasma-enhanced chemical vapor deposition process.

5. The method of claim 1, wherein the local enhancing of the deposition of material on the surface layer at each location is carried out in a time period, wherein the time period is based partly on the thickness non-uniformity profile of the surface layer.

6. The method of claim 1, wherein the surface layer comprises a piezoelectric layer.

7. The method of claim 1, wherein the surface layer comprises a passivation layer.

8. The method of claim 1, wherein the surface layer comprises an electrode layer.

9. The method of claim 1, wherein the surface layer comprises a plurality of individual bulk acoustic wave components.

10. The method of claim 9, wherein the individual bulk acoustic wave components comprise one or more resonators.

11. The method of claim 9, wherein the individual bulk acoustic wave components comprise one or more filters.

12. The method of claim 9, wherein the individual bulk acoustic wave components comprise one or more stacked crystal filters.

13. The method of claim 1, wherein the surface layer is made of a layer material, and the gaseous precursor comprises the layer material.

14. The method of claim 1, wherein the surface layer is made of a layer material, and the gaseous precursor comprises a material different from the layer material.

15. The method of claim 1, further comprising the step of mapping the device surface for determining the non-uniformity profile across the device surface.

16. The method of claim 15, wherein the mapping step is carried out by measuring the resonant frequency of the device.

17. The method of claim 15, wherein the mapping step is carried out by measuring the thickness of the device.

18. A system for tuning a bulk acoustic wave device comprising a plurality of acoustic wave generating and controlling layers formed on a substrate, wherein the bulk acoustic wave device has a surface layer and a surface layer thickness having a non-uniformity profile, and wherein the bulk acoustic wave device has an operating frequency which varies partly with the surface layer thickness and the operation frequency can be adjusted by adjusting the surface layer thickness in a chemical vapor deposition apparatus, wherein the chemical vapor deposition apparatus contains a gaseous precursor for depositing material over the surface layer for reducing the thickness non-uniformity, said system comprising:

means, for providing an enhancing medium for locally enhancing the deposition of material on the surface layer at a location; and a moving mechanism, operatively connected to the providing means, for relocating the enhancing medium in a lateral direction relative to the surface layer to at least one different location for locally enhancing the deposition of material on the surface layer at said at least one different location.

19. The system of claim 18, wherein the enhancing medium comprises a laser beam for use in a photon-assisted chemical vapor deposition process and the providing means comprises a laser for providing the laser beam.

20. The system of claim 18, wherein the enhancing medium comprises a light beam for use in a photo-assisted chemical vapor deposition process and the providing means comprises a light source.

21. The system of claim 18, wherein the enhancing medium comprises a plasma for use in a plasma-assisted chemical vapor deposition process and the providing means comprises an electrode to produce a plurality of ions for providing the plasma.

22. The system of claim 18, further comprising a mapping mechanism for obtaining the non-uniformity profile by mapping the device surface.

23. The system of claim 22, wherein the mapping mechanism comprises a frequency measurement device for determining the local resonant frequency of the device across the device surface.

24. The system of claim 22, wherein the mapping mechanism comprises a thickness measurement device.

25. The system of claim 18, wherein said relocating means has a control mechanism for relocating the enhancing medium based on the non-uniformity profile.

26. The system of claim 18, wherein the device comprises of a plurality of individual chips each having a chip surface area, and wherein the enhancing medium defines a spot size larger than the chip surface area.

27. The system of claim 18, wherein the device comprises a plurality of individual chips, each having a chip surface area, and wherein the enhancing medium defines a spot size smaller than the chip surface area.

28. The system of claim 18, further comprising a software program for controlling said relocating means according to the thickness non-uniformity profile for reducing surface non-uniformity.

* * * * *

UNITED STATES PATENT AND TRADEMARK OFFICE
CERTIFICATE OF CORRECTION

| | | |
|---|---|---|
| PATENT NO. | : 6,480,074 B1 | Page 1 of 1 |
| APPLICATION NO. | : 09/845096 | |
| DATED | : November 12, 2002 | |
| INVENTOR(S) | : Kaitila et al. | |

It is certified that error appears in the above-identified patent and that said Letters Patent is hereby corrected as shown below:

In column 2, line 3, after "$SiO_2$" --,-- should be inserted.

In column 2, line 5, after "$SiO_2$" --,-- should be inserted.

In column 5, line 60 "$NH_4$)" should be --$(NH_4)$--.

In column 8, line 22 after $SiO_2$" --,-- should be inserted.

Claims 25 and 28 were not amended and should read as follows:

--25.   The system of claim 18, wherein said moving mechanism has a control mechanism for relocating the enhancing medium based on the non-uniformity profile.

28.   The system of claim 18, further comprising a software program for controlling said moving mechanism according to the thickness non-uniformity profile for reducing surface non-uniformity.--

Signed and Sealed this

Twenty-fifth Day of December, 2007

JON W. DUDAS
*Director of the United States Patent and Trademark Office*